(12) United States Patent
Okamura

(10) Patent No.: US 6,350,674 B1
(45) Date of Patent: Feb. 26, 2002

(54) MANUFACTURING METHOD FOR SEMICONDUCTOR DEVICE HAVING A MULTILAYER INTERCONNECT

(75) Inventor: Hiroshi Okamura, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/534,937

(22) Filed: Mar. 24, 2000

(30) Foreign Application Priority Data

Apr. 5, 1999 (JP) .......................................... 11-097357

(51) Int. Cl.⁷ ......................................... H01L 21/4763
(52) U.S. Cl. ........................ 438/624; 438/640; 438/671
(58) Field of Search ............................... 438/597, 624, 438/638, 640, 671, 672

(56) References Cited

U.S. PATENT DOCUMENTS

| | | | |
|---|---|---|---|
| 5,635,423 A | * 6/1997 | Huang et al. | 438/640 |
| 5,877,076 A | * 3/1999 | Dai | 438/624 |
| 6,010,955 A | * 1/2000 | Hashimoto | 438/624 |
| 6,017,817 A | 1/2000 | Chung et al. | 438/637 |
| 6,066,569 A | 5/2000 | Tobben | 438/717 |
| 6,211,061 B1 | 4/2001 | Chen et al. | 438/638 |

FOREIGN PATENT DOCUMENTS

| | | | |
|---|---|---|---|
| JP | 55-91827 | * | 7/1980 |
| JP | 8-17918 | | 1/1996 |

\* cited by examiner

*Primary Examiner*—Chandra Chaudhari

(57) ABSTRACT

A semiconductor device having good electrical properties, and a method of manufacturing this semiconductor device by forming an insulation layer on a first wiring layer and then, simultaneously forming in this insulation layer a second wiring layer and a contact layer for connecting the first wiring layer and the second wiring layer. A positive resist layer having an opening over an area where a through-hole is to be formed is first formed on the insulation layer. A negative resist layer having an opening over an area where a wiring trench is to be formed is then formed on the positive resist layer. The insulation layer, positive resist layer, and negative resist layer are then simultaneously etched to form a wiring trench and through-hole that are automatically aligned with each other. The wiring trench and through-hole are then filled with a conductive material to form a second wiring layer and contact layer.

9 Claims, 6 Drawing Sheets

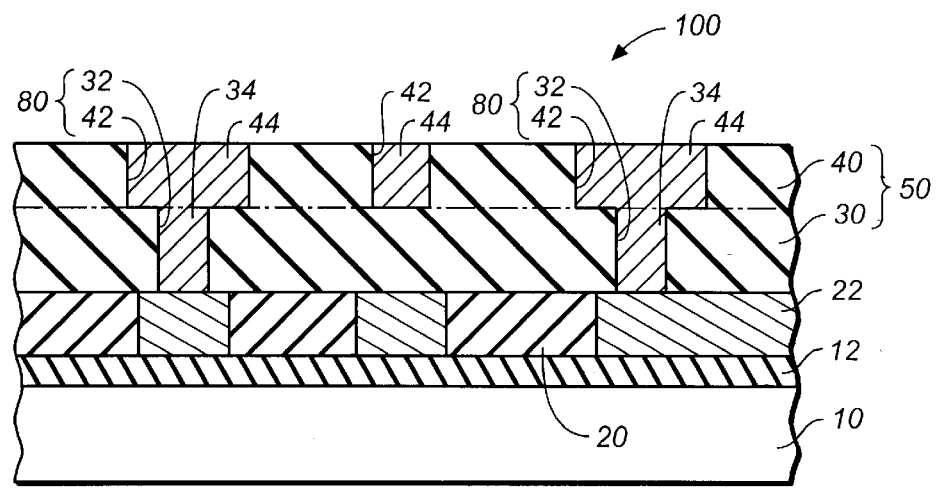
FIG._1
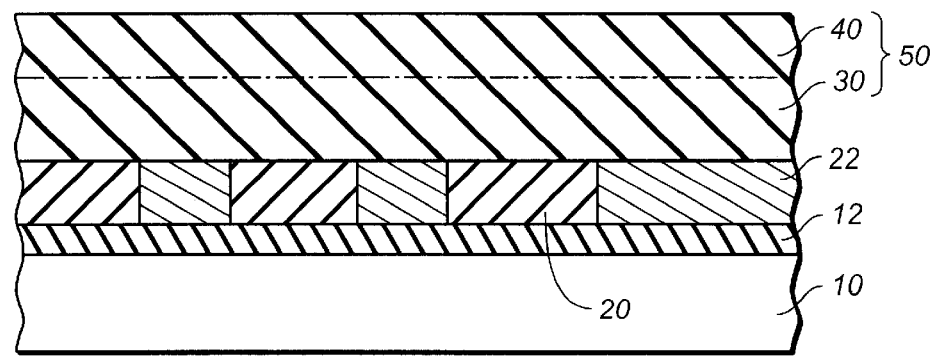
FIG._2
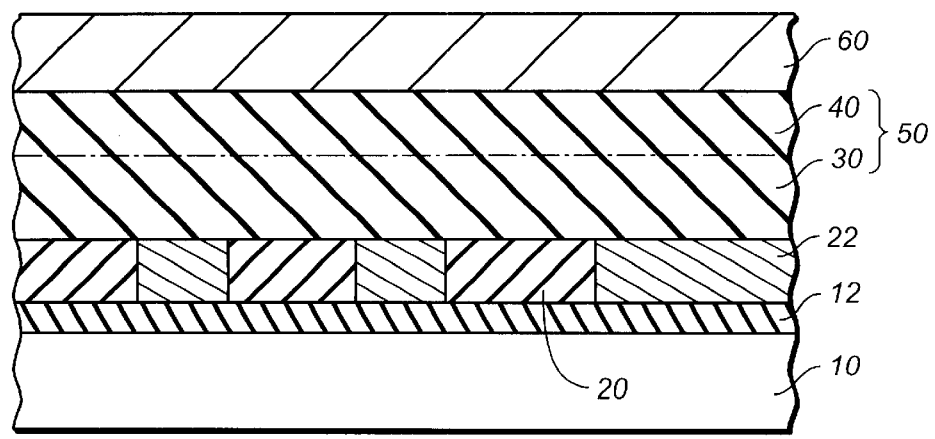
FIG._3

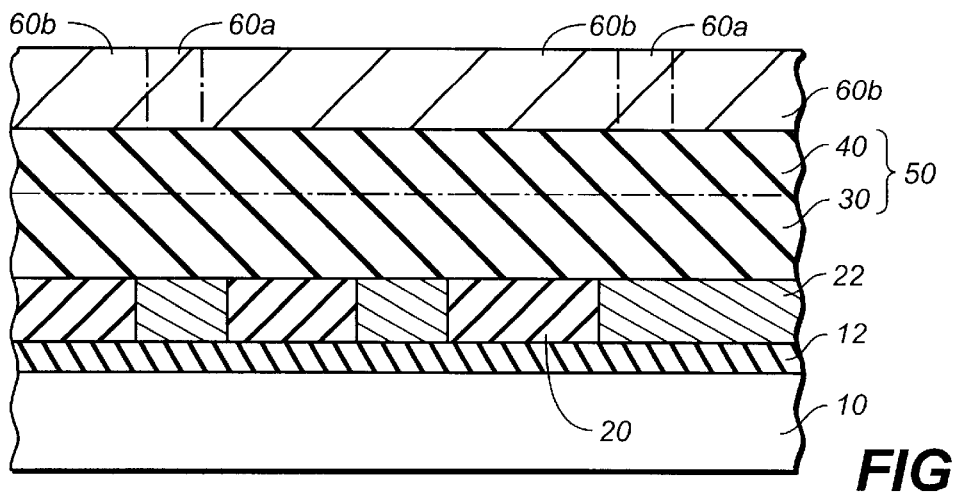
FIG._4
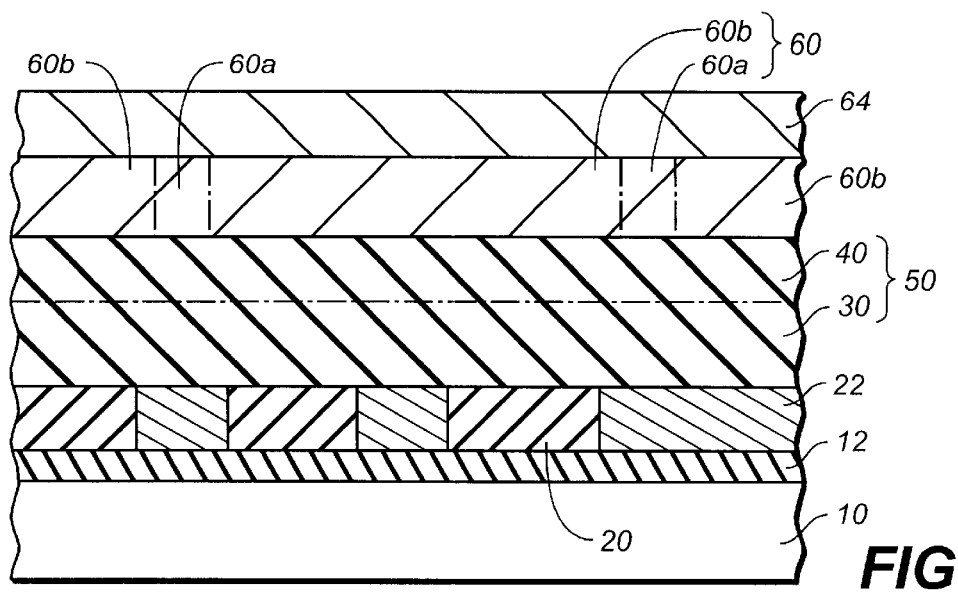
FIG._5
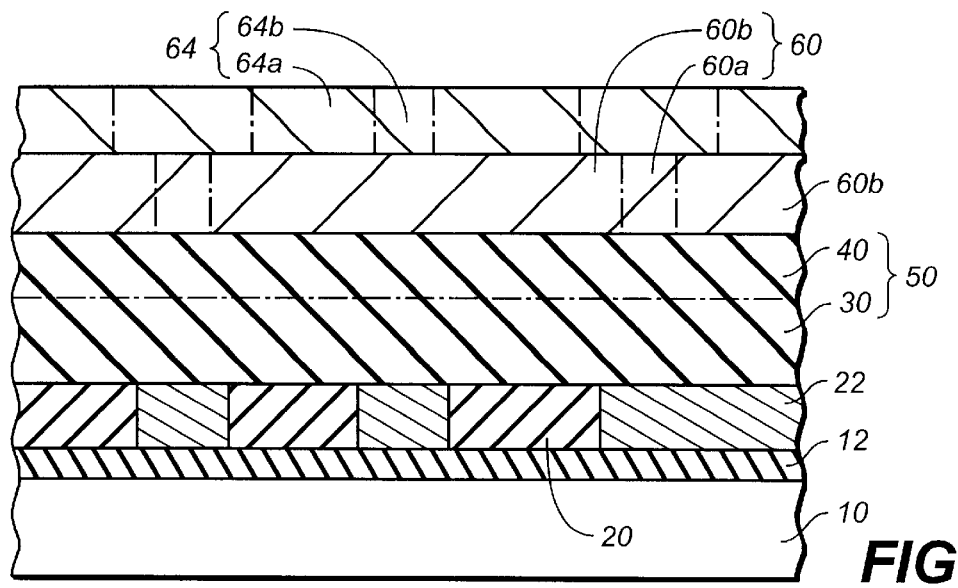
FIG._6

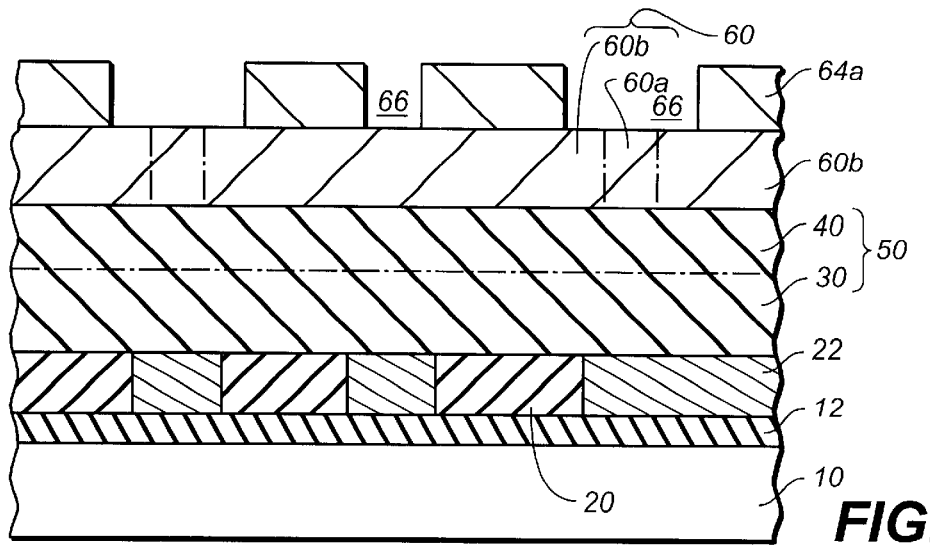
FIG._7
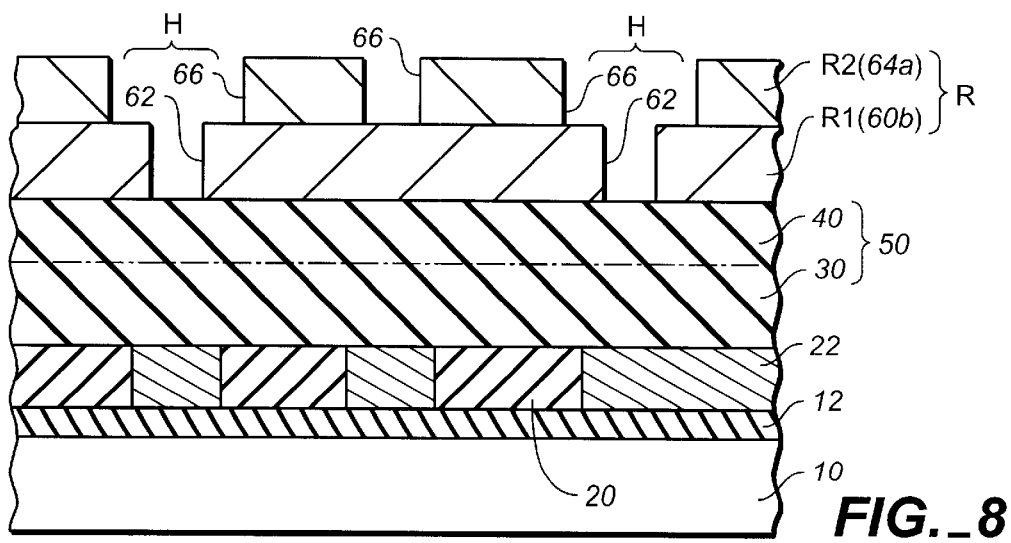
FIG._8
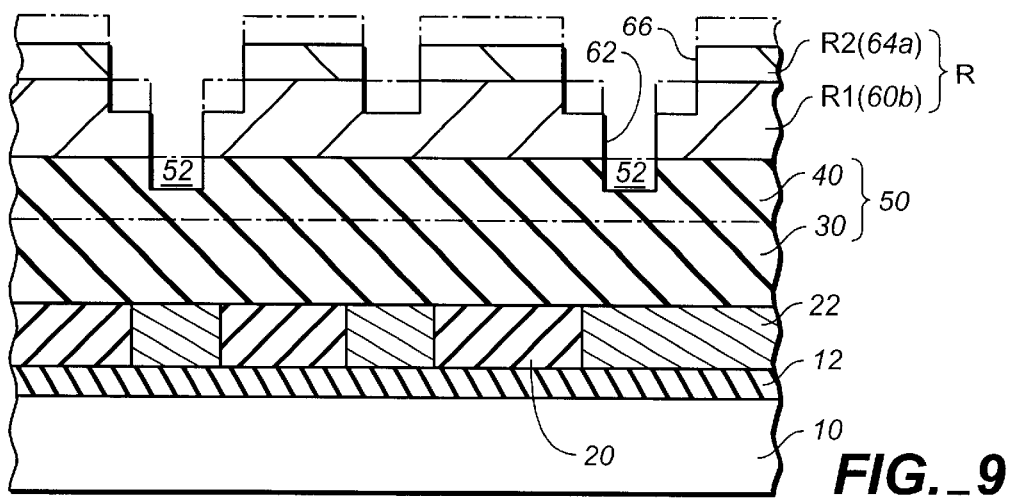
FIG._9

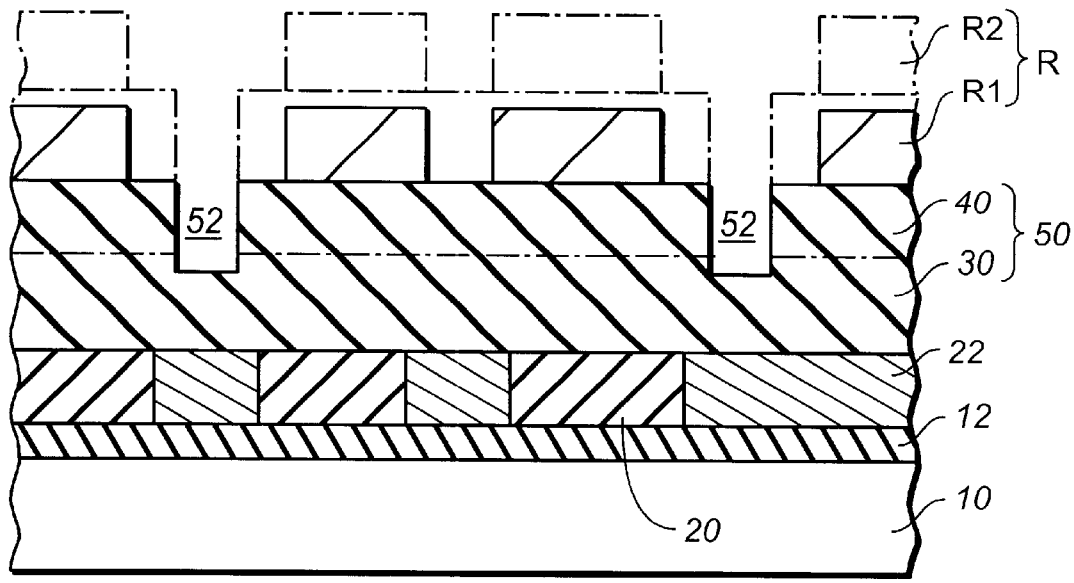
FIG._10
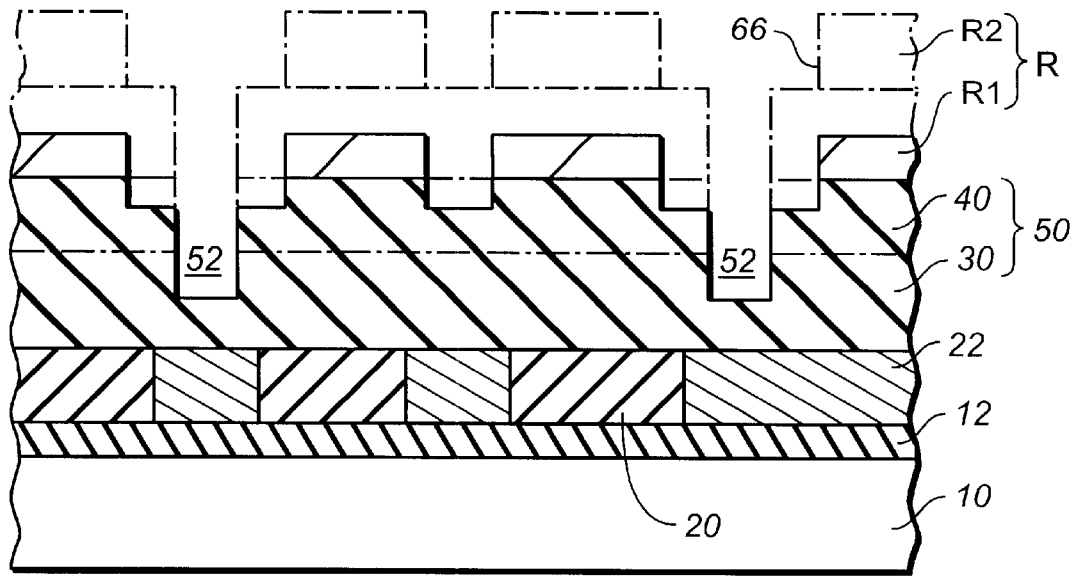
FIG._11

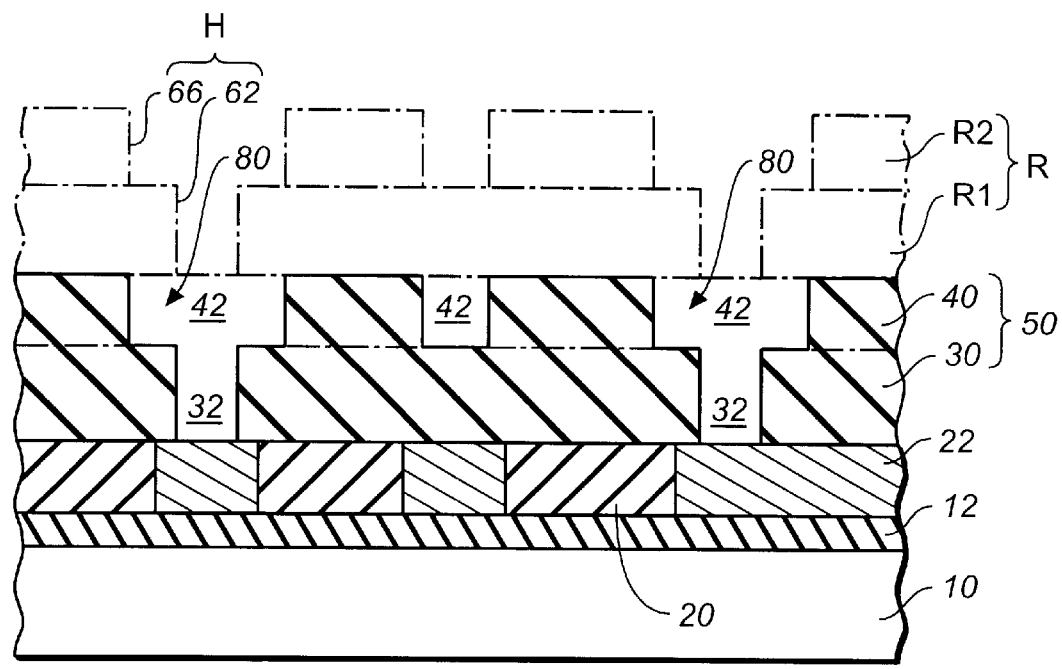
FIG._12
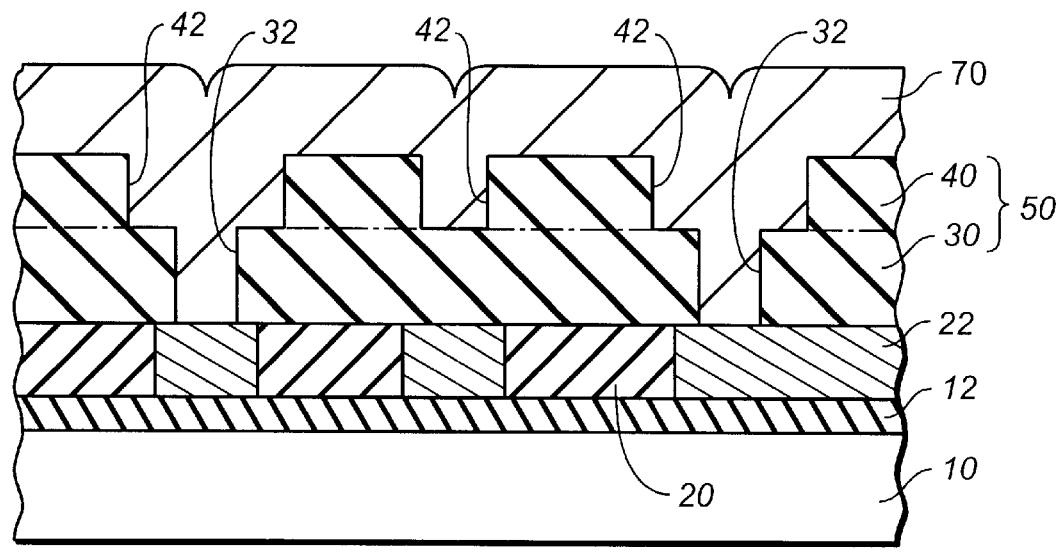
FIG._13

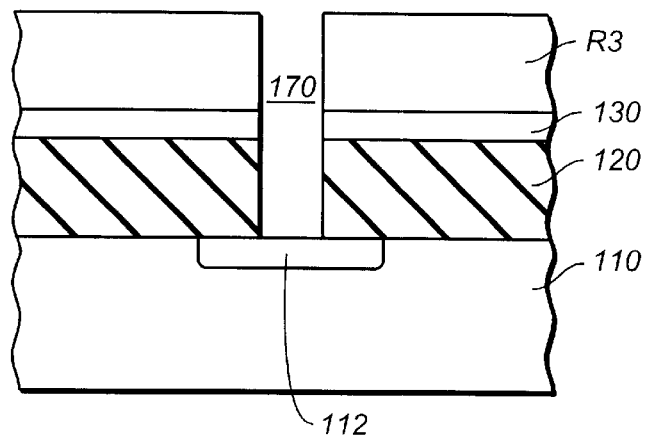
FIG._14
(PRIOR ART)
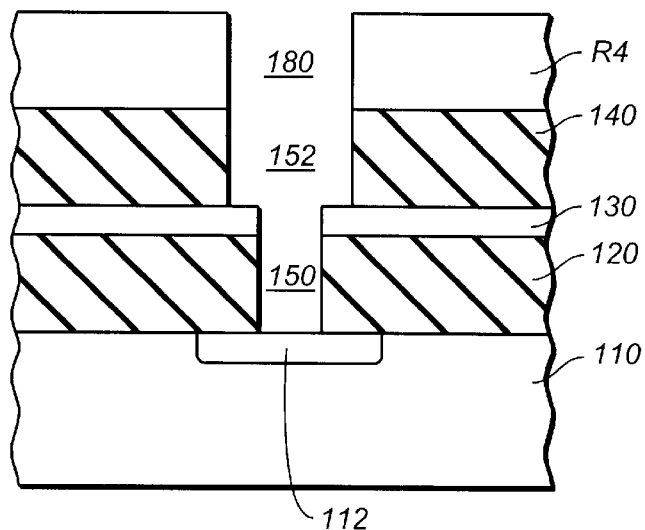
FIG._15
(PRIOR ART)
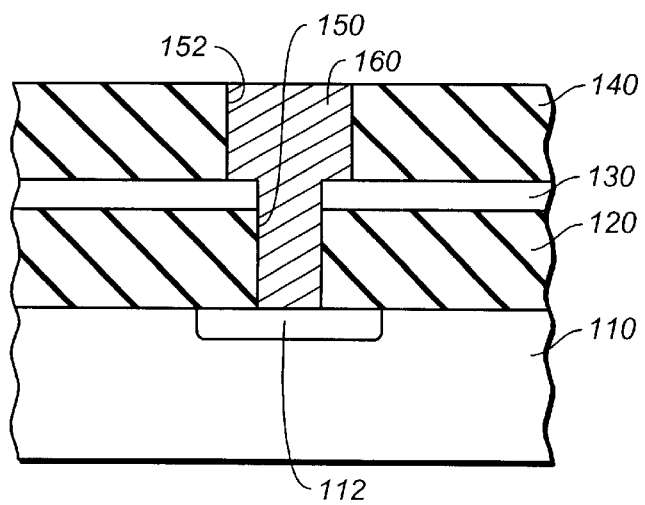
FIG._16
(PRIOR ART)

MANUFACTURING METHOD FOR SEMICONDUCTOR DEVICE HAVING A MULTILAYER INTERCONNECT

BACKGROUND OF THE INVENTION

1. Field of the Invention

The present invention relates to a manufacturing method for a semiconductor device, and relates more particularly to a manufacturing method for a semiconductor device having a multilayer interconnect.

2. Description of the Related Art

With the progress in miniaturization and integration of semiconductor devices, the number of interconnect layers has steadily increased. This has resulted in the number of processes required to form the wiring layers and the contact layers for electrically interconnecting the wiring layers accounting for a larger percentage of the total number of processes in the manufacture of a semiconductor device. The method of forming the wiring layers and contact layers thus occupies an extremely important position in the overall semiconductor device manufacturing process.

One technique for easily and simultaneously forming wiring and contact layers is the dual damascene method. The technique that is taught in Japanese Unexamined Patent Application (kokai) 8-17918 is described below as an example of this dual damascene method.

Typical steps in the production of a wiring layer and contact layer using this dual damascene method are shown in FIG. 14 to FIG. 16.

Referring first to FIG. 14, a first insulation layer 120 is formed on a silicon substrate 110 in which a diffusion layer 112 is formed. A silicon nitride layer 130 is then formed over the first insulation layer 120, and a resist layer R3 is formed over the silicon nitride layer 130. There is an opening 170 in the resist layer R3 above a spot where a contact hole 150, further described below, is to be formed. The silicon nitride layer 130 is then etched.

Referring next to FIG. 15, after the resist layer R3 is removed, a second insulation layer 140 is formed over the silicon nitride layer 130 and first insulation layer 120. Another resist layer R4 is then formed on this second insulation layer 140. There is an opening 180 in this resist layer R4 positioned at the area where a trench 152, further described below, is to be formed. The second insulation layer 140 is then etched using the resist layer R4 as a mask to form a trench 152, and the first insulation layer 120 is etched using the silicon nitride layer 130 as a mask to form a contact hole 150.

After first removing the resist layer R4, the contact hole 150 and trench 152 are then filled with a conductive material so as to cover all surfaces thereof. See FIG. 16. The surface is then polished using a chemical-mechanical polishing (CMP) technique to form an embedded wiring layer 160.

It will be appreciated from the above description that a silicon nitride layer 130, which functions as a mask for etching the first insulation layer 120, must be disposed between the first insulation layer 120 and second insulation layer 140 in order to form contact hole 150 and trench 152 with the above method. When a silicon nitride layer 130 is disposed between the first insulation layer 120 and second insulation layer 140, a resistance-capacitance (RC) wiring delay occurs as a result of the high dielectric constant of the silicon nitride layer 130. That is, a delay in signal transmission occurs because of an increase in line resistance and an increase in line capacitance. The presence of an RC wiring delay leads to various problems, including a drop in the processing capacity (e.g., speed) of the semiconductor device, operational errors resulting from cross-talk, and an increase in temperature (heat output) in conjunction with an increase in power consumption.

OBJECTS OF THE INVENTION

Therefore, it is an object of the present invention to overcome the aforementioned problems.

A more particular object of the present invention is to resolve the above noted problems by providing a semiconductor device having good electrical characteristics, and by providing a manufacturing method for such semiconductor device.

SUMMARY OF THE INVENTION

To achieve these objects, the present invention provides a method for manufacturing a semiconductor device having a plurality of wiring layers, and an insulation layer intervening between wiring layers, and comprises the following steps:

(A) forming an insulation layer on a first wiring layer;

(B) forming in a top part of the insulation layer a wiring trench in an area where a second wiring layer will be formed, and forming in a bottom part of the insulation layer a through-hole in an area where a contact layer for electrically connecting the second wiring layer and first wiring layer will be formed; and (C) filling a conductive material into the wiring trench and through-hole to integrally form the second wiring layer in the wiring trench with the contact layer in the through-hole.

Step (B) in this method includes the following steps:

(a1) forming a first resist layer with a first photosensitivity characteristic on the insulation layer, the first resist layer having a first opening above an area where the through-hole is to be formed, and (a2) forming a second resist layer on the first resist layer, the second resist layer having a second photosensitivity characteristic that is different from the first photosensitivity characteristic of the first resist layer, and the second resist layer having a second opening above an area where the wiring trench is to be formed; and (b) etching the insulation layer and removing the first and second resist layers during the etching of the insulation layer.

The above noted difference in photosensitivity characteristics refers to the difference between a positive resist and negative resist. More specifically, when the first resist layer is a positive resist, the second resist layer is a negative resist; when the first resist layer is a negative resist, the second resist layer is a positive resist.

A wiring trench and through-hole can thus be formed in automatic alignment as a result of the process described below according to the present invention without disposing a silicon nitride layer between insulation layers. More specifically, by etching the insulation layer through the opening in the first resist layer, a trench is formed in the top of the insulation layer and the resist layer is simultaneously removed. When the first resist layer not covered by the second resist layer is removed, the shape of the trench is the shape of the through-hole to be formed. As etching of the insulation layer continues, the insulation layer (where the wiring trench is formed) is etched through the opening in the second resist layer while maintaining the shape of the trench. When the bottom of the trench is etched to the first wiring layer, a wiring trench is formed in the top part of the insulation layer and a through-hole is formed in the bottom of the insulation layer. It is thus possible to form a wiring trench and through-hole without a silicon nitride layer intervening in the insulation layer, and steps for forming a silicon nitride layer and then forming an opening in the silicon nitride layer can be omitted.

It should be noted that with the manufacturing method of the invention the angle formed by the bottom of the wiring trench and the side wall of the through-hole is substantially a right angle.

It should be further noted that the depth ratio between the through-hole and wiring trench can be controlled by appropriately controlling the resist layer configuration (particular the layer thickness of the first resist layer and second resist layer), and etching conditions (such as the relative selectivity of the resist layers and insulation layer).

A semiconductor device resulting from this manufacturing method does not have a silicon nitride layer intervening between insulation layers. As a result, the dielectric constant between a first wiring layer and second wiring layer can be held to that resulting only from the insulation layer between wiring layers. The RC wiring delay can therefore be kept to the absolute minimum.

In the manufacturing method of the invention, steps (a1) and (a2) for forming the first and second resist layers comprise:

(c) forming the first resist layer on the insulation layer;

(d) exposing a part of the first resist layer;

(e) forming the second resist layer on the first resist layer;

(f) exposing a part of the second resist layer;

(g) developing the second resist layer and forming the second opening; and (h) developing the first resist layer and forming the first opening.

It should be noted that step (h) can be performed either before step (e) or after step (g).

The developer used in resist layer development step (g) is preferably a developer that will not remove the first resist layer. Further preferably, the developer used in resist layer development step (h) is a developer that will not remove the second resist layer.

Yet further preferably, the etchant used for etching in step (b) is a mixed gas containing a CF gas. This CF gas is yet further preferably one or more of the following: $CF_4$, $CHF_3$, $C_2F_6$, $C_4F_8$, and $C_5F_8$. Yet further preferably, the mixed gas containing a CF gas contains at least one of the following: CO, Ar, $O_2$, and $N_2$.

The conductive material used to fill the wiring trench and through-hole preferably contains aluminum or copper.

It should be noted that the first wiring layer in a semiconductor device according to this invention includes a first, second, or subsequent wiring layer, or a conductive part of a semiconductor element such as a gate electrode or diffusion layer formed on a substrate surface.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts:

FIG. 1 is a typical section view of a semiconductor device according to a preferred embodiment of the present invention;

FIG. 2 to FIG. 13 are section views illustrating various steps in a manufacturing method for a semiconductor device according to the present invention; and FIG. 14 to FIG. 16 are section views illustrating various steps in a typical manufacturing method for a semiconductor device according to the related art.

DESCRIPTION OF THE PREFERRED EMBODIMENTS

A preferred embodiment of the present invention is described below with reference to the accompanying figures.

1. Device Structure

A semiconductor device 100 according to a preferred embodiment of the present invention is described below with reference to FIG. 1, which is a section view of this semiconductor device 100.

In semiconductor elements such as MOSFETs, a wiring layer, and element isolation areas (not shown in the figure) are formed on the surface of substrate 10 of a semiconductor device 100 according to this preferred embodiment. A first interlayer insulation layer 12 is formed on substrate 10. A contact layer (not shown in the figure) for connecting a first wiring layer 22 with a semiconductor element or wiring layer formed on the surface of substrate 10 is formed in this first interlayer insulation layer 12.

A first wiring layer 22 and first wiring insulation layer 20 are formed on top of the first interlayer insulation layer 12. This first wiring insulation layer 20 is formed to provide separations in the first wiring layers 22. Note that the first wiring layer 22 and first wiring insulation layer 20 are formed so that the top surfaces thereof are substantially flush, that is, the layers are formed with the same thickness.

A second interlayer insulation layer 30 is then formed on first wiring layer 22 and first wiring insulation layer 20. A through-hole 32 is formed at a specific position in the second interlayer insulation layer 30.

A second wiring insulation layer 40 is formed on the second interlayer insulation layer 30. A wiring trench 42 is formed at a specific location in the second wiring insulation layer 40. Note that the second interlayer insulation layer 30 and second wiring insulation layer 40 are integrally formed.

The through-hole 32 and wiring trench 42 are connected and positioned relative to each other to form a stepped trench 80. The through-hole 32 and wiring trench 42 are then filled with a conductive material, thus integrally forming a contact layer 34 in through-hole 32 with a second wiring layer 44 in wiring trench 42. The top of the second wiring layer 44 and the top of the second wiring insulation layer 40 are substantially flush, that is, the layers are formed to the same thickness.

It will thus be evident that a silicon nitride layer does not intervene between second interlayer insulation layer 30 and second wiring insulation layer 40 in a semiconductor device 100 according to this preferred embodiment of the invention. The dielectric constant between the first wiring layer 22 and second wiring layer 44 can thus be kept to the minimum, which is that resulting from the second interlayer insulation layer 30 only. As a result, the RC wiring delay can be minimized.

2. Manufacturing Process

A method of manufacturing a semiconductor device 100 according to this preferred embodiment of the invention is described next below. FIG. 2 to FIG. 13 are section views of the semiconductor device 100 at typical steps during its manufacture according to this method of the invention.

(1) Forming the device from the substrate to second interlayer insulation layer

Referring first to FIG. 2, in semiconductor elements such as MOSFETs, a wiring layer, and element isolation areas (not shown in the figure) are formed on the surface of substrate 10 using a commonly known method. A through-hole and contact layer (not shown in the figure) are formed in first interlayer insulation layer 12. The first wiring insulation layer 20 and first wiring layer 22 are then formed. They are planarized and polished as may be required using a CMP technique so that the top of first wiring layer 22 and the top of first wiring insulation layer 20 are at the same height relative to the substrate 10.

As shown in FIG. 2, a second interlayer insulation layer 30, in which through-hole 32 is formed, and a second wiring insulation layer 40, in which wiring trench 42 is formed, are integrally formed in an uninterrupted sequence on first wiring layer 22 and first wiring insulation layer 20. It should be noted that second interlayer insulation layer 30 and second wiring insulation layer 40 are collectively referred to below as insulation layer 50.

This insulation layer 50 is preferably silicon dioxide, and is preferably a low dielectric constant inorganic or organic material with a dielectric constant of 3 or less. Exemplary inorganic materials with a low dielectric constant include fluorine doped silicon dioxide, silicon dioxide compounds, and porous silicon compounds; exemplary organic materials with a low dielectric constant include organic polymers. Exemplary methods for forming this insulation layer 50 include high density plasma enhanced CVD, thermal CVD, plasma CVD, atmospheric pressure CVD, spin coating and other coating methods, sputtering, and thermal vapor deposition. The thickness of the accumulated insulation layer 50 will depend upon the device specifications, but is typically 200 nm to 2000 nm.

(2) Forming a resist

Referring next to FIG. 3, a positive resist layer 60 is formed on the insulation layer 50. Then, as shown in FIG. 4, a selected part of this positive resist layer 60 is exposed to light. The part of the positive resist layer 60 that is exposed is the part that is positioned above the area where through-hole 32 is to be formed. This produces an exposed part 60a and an unexposed part 60b in the positive resist layer.

A negative resist layer 64 is then formed on the positive resist layer 60 as shown in FIG. 5. A selected part of this negative resist layer 64 is then exposed as shown in FIG. 6. More specifically, all parts of the negative resist layer 64 will be exposed except that part positioned above the area where wiring trench 42 is to be formed. This produces an exposed part 64a and an unexposed part 64b in the negative resist layer.

The negative resist layer 64 is then patterned using an appropriate developer to form opening 66 by removing the unexposed part 64b of the negative resist layer as shown in FIG. 7. As noted above, opening 66 is formed above where the wiring trench 42 is to be formed.

The developer used to remove the unexposed part 64b of the negative resist layer shall not be specifically limited as long as it will not remove the unexposed part 60b of the positive resist layer. Exemplary developers for thus removing the unexposed part 64b of the negative resist layer include esters, xylene, and other organic solvents.

The positive resist layer 60 is then patterned using an appropriate developer to form one or more openings 62 by removing the exposed part 60a of the positive resist layer as shown in FIG. 8. Opening 62 is formed above where through-hole 32 is to be formed.

The developer used to remove this exposed part 60a of the positive resist layer shall not be specifically limited as long as it will not remove the exposed part 64a of the negative resist layer. Exemplary developers for thus removing the exposed part 60a of the positive resist layer include organic alkaline solutions of primarily tetramethylammonium hydroxide (TMAH) or choline, for example.

The unexposed part 60b of the positive resist layer that is left after the above development step is referred to below as the first resist layer R1, and the remaining exposed part 64a of the negative resist layer is referred to as the second resist layer R2. The first resist layer R1 and second resist layer R2 are also referred to below in toto as the resist layer R.

An opening 66 is thus formed at a specific position in the second resist layer R2. In addition, an opening 62 is formed in the first resist layer R1 below opening 66 in the second resist layer R2. As a result, a stepped opening H is formed in the resist layer R.

(3) Forming a stepped trench

The resist layer R and insulation layer 50 are then simultaneously etched to transfer the shape of stepped opening H in resist layer R into the insulation layer 50 and form a stepped trench 80 as shown in FIG. 12. More specifically, a wiring trench 42 in the top part (second wiring insulation layer 40) of the insulation layer 50, and a through-hole 32 in the bottom part (second interlayer insulation layer 30) of the insulation layer 50 are simultaneously formed and automatically aligned with each other.

This process of transferring the form of the stepped opening H in resist layer R into the insulation layer 50 by simultaneously etching resist layer R and insulation layer 50 is described next below with reference to FIG. 9 to FIG. 12.

Referring first to FIG. 9, etching in the insulation layer 50 begins at opening 62 in the first resist layer R1. This means that the insulation layer 50 is first etched above the area where through-hole 32 is formed, thus producing trench 52 in the top part of insulation layer 50. Note that the resist layer R is also etched away when the insulation layer 50 is etched.

Once the first resist layer R1 not covered by the second resist layer R2 is removed, as a result of etching progressing in this manner, the shape of trench 52 etched into insulation layer 50 is the shape of the through-hole 32 to be formed. See FIG. 10.

If etching is then continued (FIG. 11), the insulation layer 50 is etched further with the bottom of the trench 52 descending toward the first wiring layer 22. Also, the top of the insulation layer 50, that is, the area where wiring trench 42 is being formed, is etched in the shape of opening 66, which has been etched into the first resist layer R1. As noted above, the resist layer R continues to be etched simultaneously with etching the insulation layer 50. Etching the insulation layer 50 thus continues until the bottom of the trench 52 reaches the top of the first wiring layer 22 with the shape of trench 52 maintained until etching stops.

When the bottom of trench 52 reaches the top of first wiring layer 22, a wiring trench 42 is formed in the top part (the second wiring insulation layer 40) of the insulation layer 50, and a through-hole 32 is formed in the bottom part (the second interlayer insulation layer 30) of the insulation layer 50, as shown in FIG. 12. The shape of the stepped opening H in resist layer R is thus transferred to the insulation layer 50, forming a stepped trench 80. Any resist layer R remaining on the insulation layer 50 when etching is stopped is then removed as required.

The preferred method of simultaneously etching insulation layer 50 and resist layer R is a dry etching technique. Using a dry etching technique enables the etching rate of the insulation layer 50 to be controlled independently of the etching rate of the resist layer R by adjusting the etching conditions (e.g., the etchant, plasma density, pressure, and temperature). Dry etching also enables this first etching step and a second etching step further described below to be accomplished in the same etching chamber.

The etchant used for this etching step shall not be limited as long as it enables the insulation layer 50 and the resist layer R to be etched simultaneously.

However, the preferred etchant is a mixed gas containing a CF gas. Furthermore, this CF gas is preferably one or more of the following: $CF_4$, $CHF_3$, $C_2F_6$, $C_4F_8$, and $C_5F_8$. The mixed gas containing a CF gas further preferably contains one or more of the following: CO, Ar, $O_2$, and $N_2$.

(4) Forming the wiring layer and contact layer

Referring next to FIG. 13, a conductive layer 70 is formed over the insulation layer 50 so as to fill through-hole 32 and wiring trench 42. This conductive layer 70 can be a single primary layer comprising a material selected from the group consisting of an Al alloy, a Cu alloy, a pure copper, or a tungsten, or the conductive layer 70 can be a multilayer structure having a barrier layer or a wetting layer below the above described primary wiring layer.

A typical multilayer structure in which an Al alloy layer is the primary wiring layer could be Ti/TiN/Al—Cu, Ti/Al—Cu, Ta/TaN/Al—Cu, or Nb/Al—Cu. If the wiring layer is primarily Cu, typical multilayer structures include Ti/TiN/Cu, Ta/TaN/Cu, and WN/Cu.

Exemplary methods for forming this conductive layer 70 include CVD, plating methods, sputtering, vapor deposition, and coating methods.

The conductive layer 70 is then polished and planarized so that the top of the second wiring insulation layer 40 and the top of the conductive layer 70 are at substantially the same height relative to the substrate 10. Exemplary methods for polishing the conductive layer 70 include CMP, dry etch back, and wet removal.

As a result of the above-described process, a contact layer 34 is formed in through-hole 32, and second wiring layer 44 is formed in wiring trench 42. A semiconductor device 100 according to this preferred embodiment of the present invention as shown in FIG. 1 is thus achieved.

Some novel features of the present invention are described below.

(1) First, the resist layer R and insulation layer 50 are etched simultaneously to form in the insulation layer 50 a stepped trench 80 reflecting the shape of an opening H formed in the resist layer R. More specifically, a wiring trench 42 and through-hole 32 are formed simultaneously and are automatically aligned with each other. Thus, forming the through-hole 32 and wiring trench 42 has the following advantages.

The through-hole 32 and wiring trench 42 can be formed simultaneously without a silicon nitride layer intervening between the second interlayer insulation layer 30 and second wiring insulation layer 40. Steps for forming such an intervening silicon nitride layer and for forming an opening appropriately in the silicon nitride layer can thus be omitted.

The resist layer R is also removed simultaneously with etching the insulation layer 50 in the manufacturing method of the invention. A separate step for removing the resist layer R can thus be omitted.

Furthermore, because the shape of the stepped trench 80 formed in insulation layer 50 copies the shape of the opening H in the resist layer R, the ratio of the depths of through-hole 32 and wiring trench 42 in the insulation layer 50 can be controlled by controlling the shape of the resist layer R (particularly the layer thickness of first resist layer R1 and the layer thickness of second resist layer R2) and the etching conditions (e.g., the relative etching rates of the resist layers and the insulation layer).

The ability to form through-hole 32 and wiring trench 42 simultaneously also makes it possible to simplify the manufacturing process.

(2) Second, resist layer R is formed by a method including the following steps:

1. forming and exposing a positive resist layer 60 on insulation layer 50, and then forming and exposing a negative resist layer 64 on positive resist layer 60;

2. developing the negative resist layer 64 using a developer that will not remove the unexposed part 60*b* of the positive resist layer to form an opening 66 at a specific location; and 3. developing the positive resist layer 60 using a developer that will not remove the exposed part 64*a* of the negative resist layer to form an opening 62 at a specific location.

By thus forming the resist layer R, the opening H can be formed with a sharp, stepped shape in resist layer R, that is, with the bottom of opening 66 in second resist layer R2 at a substantially right angle to the sides of opening 62 in first resist layer R1. The reasons for this include the following.

The shape of unexposed part 60*b* in the positive resist layer does not change when developing the negative resist layer 64 because the developer used for negative resist layer 64 is one that does not remove the unexposed part 60*b* of the positive resist layer. The shape of the exposed part 64*a* in the negative resist layer also does not change when developing the positive resist layer 60 because the developer used for the positive resist layer 60 is one that does not remove the exposed part 64*a* of the negative resist layer. A sharp stepped shape can thus be achieved in opening H in resist layer R.

In addition, a less rigorous photolithography step can be used for forming through-hole 32. That is, because the through-hole 32 pattern is part of the pattern of the positive resist layer 60, reduction of the through-hole 32 as a result of alignment error is eliminated, interruptions resulting from an insufficient metal gap-fill margin can be prevented, degraded electromigration can be prevented, and an increase in contact resistance can be prevented. As a result, wiring reliability can be improved.

It will be obvious to one with ordinary skill in the related art that this preferred embodiment of the invention can be varied in many ways within the scope of the accompanying claims. A few such variations are described below.

(1) Through-hole 32 and wiring trench 42 are formed simultaneously in the insulation layer 50 formed on first wiring layer 22 in the above embodiment. But, the present invention can be applied to simultaneously form a contact hole and wiring trench in any first, second, or subsequent insulation layer 50 formed on the surface of a substrate having a semiconductor element formed thereon.

(2) The resist layer R described above has the positive resist layer 60 formed first with the negative resist layer 64 formed on the positive resist layer 60. This order can be reversed, however, so that the positive resist layer is formed on the negative resist layer.

(3) While the positive resist layer 60 is first exposed, and the negative resist layer 64 is then formed thereon without developing the positive resist layer 60 in the above-described embodiment, the positive resist layer 60 can be developed before forming the negative resist layer 64.

(4) Different developers are used above to develop the negative resist layer and positive resist layer. However, it is also possible to use the same developer to simultaneously form openings in two resist layers by changing the concentration of the developer part way through the developing process.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A manufacturing method for a semiconductor device having a plurality of wiring layers and an insulation layer present between said wiring layers, said manufacturing method comprising:

(A) forming an insulation layer on a first wiring layer;

(B) forming in a top part of said insulation layer a wiring trench in an area where a second wiring layer will be formed, and forming in a bottom part of said insulation layer a through-hole in an area where a contact layer for electrically connecting said second wiring layer and said first wiring layer will be formed; and (C) filling a conductive material into said wiring trench and said through-hole to integrally form said second wiring layer in said wiring trench with said contact layer in said through-hole; and wherein said step (B) comprises:

(a1) forming a first resist layer with a first photosensitivity characteristic on said insulation layer, said first resist layer having a first opening above an area where said through-hole is to be formed, and (a2) forming a second resist layer on said first resist layer, said second resist layer having a second photosensitivity characteristic that is different from said first photosensitivity characteristic of said first resist layer, and said second resist layer having a second opening above an area where said wiring trench is to be formed; and (b) etching said insulation layer and removing said first and second resist layers during the etching of said insulation layer.

2. A semiconductor device manufacturing method as in claim 1, wherein said first resist layer is a positive resist layer, and said second resist layer is a negative resist layer.

3. A semiconductor device manufacturing method as in claim 1, wherein said first resist layer is a negative resist layer, and said second resist layer is a positive resist layer.

4. A semiconductor device manufacturing method as in claim 1, wherein said steps (a1) and (a2) for forming said first and second resist layers comprise:

(c) forming said first resist layer on said insulation layer;

(d) exposing a part of said first resist layer;

(e) forming said second resist layer on said first resist layer;

(f) exposing a part of said second resist layer;

(g) developing said second resist layer and forming said second opening; and (h) developing said first resist layer and forming said first opening.

5. A semiconductor device manufacturing method as in claim 4, wherein said step (g) comprises developing said second resist layer with a developer that will not remove said first resist layer, and said step (h) comprises developing said first resist layer with a developer that will not remove said second resist layer.

6. A semiconductor device manufacturing method as described in claim 5, wherein an etchant used for etching in step (b) comprises a mixed gas containing a CF gas.

7. The semiconductor device manufacturing method as described in claim 6, wherein said CF gas is at least one of $CF_4$, $CHF_3$, $C_2F_6$, $C_4F_8$, and $C_5F_8$.

8. The semiconductor device manufacturing method as described in claim 7, wherein said mixed gas containing a CF gas contains at least one of CO, Ar, $O_2$, and $N_2$.

9. The semiconductor device manufacturing method as in claim 1, wherein said conductive material comprises at least one of aluminum and copper.

* * * * *